United States Patent
Hart et al.

(10) Patent No.: US 11,425,841 B2
(45) Date of Patent: Aug. 23, 2022

(54) USING THERMALIZING MATERIAL IN AN ENCLOSURE FOR COOLING QUANTUM COMPUTING DEVICES

(71) Applicant: International Business Machines Corporation, Armonk, NY (US)

(72) Inventors: Sean Hart, Tarrytown, NY (US); Daniela Florentina Bogorin, Syracuse, NY (US); Nicholas Torleiv Bronn, Long Island City, NY (US); Patryk Gumann, Tarrytown, NY (US); Salvatore Bernardo Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 330 days.

(21) Appl. No.: 16/561,920

(22) Filed: Sep. 5, 2019

(65) Prior Publication Data
US 2021/0076530 A1 Mar. 11, 2021

(51) Int. Cl.
*H05K 7/20* (2006.01)
*G06N 10/00* (2022.01)
(Continued)

(52) U.S. Cl.
CPC ............ *H05K 7/203* (2013.01); *F25B 9/12* (2013.01); *F25D 3/10* (2013.01); *G06F 1/20* (2013.01);
(Continued)

(58) Field of Classification Search
CPC ............ H05K 7/203; H05K 7/20372; H05K 7/20781; H05K 7/20772; H05K 7/20236;
(Continued)

(56) References Cited

U.S. PATENT DOCUMENTS

| 4,136,526 A | 1/1979 | Chanin et al. |
| 4,300,360 A | 11/1981 | Chanin et al. |

(Continued)

FOREIGN PATENT DOCUMENTS

EP 0439298 A2 7/1991

OTHER PUBLICATIONS

Peterson et al., "Large superfluid helium system at Fermilab", Fermi National Accelerator Labratory, Fermilab-Pub-99/285 (Jan. 2000). 5 pages.
(Continued)

*Primary Examiner* — Emmanuel E Duke
(74) *Attorney, Agent, or Firm* — Amin, Turocy & Watson, LLP

(57) ABSTRACT

Devices, systems, methods, and computer-implemented methods to facilitate employing thermalizing materials in an enclosure for quantum computing devices are provided. According to an embodiment, a system can comprise a quantum computing device and an enclosure having the quantum computing device disposed within the enclosure. The system can further comprise a thermalizing material disposed within the enclosure, with the thermalizing material being adapted to thermally link a cryogenic device to the quantum computing device.

20 Claims, 10 Drawing Sheets

(51) Int. Cl.
*F25B 9/12* (2006.01)
*F25D 3/10* (2006.01)
*G06F 1/20* (2006.01)
*H01L 39/04* (2006.01)
*H01L 39/24* (2006.01)

(52) U.S. Cl.
CPC ............ *G06N 10/00* (2019.01); *H01L 39/04* (2013.01); *H01L 39/24* (2013.01); *H05K 7/20372* (2013.01); *G06F 2200/201* (2013.01)

(58) Field of Classification Search
CPC ... G06N 10/00; F25B 9/12; F25B 9/10; F25D 3/10; F25D 19/006; G06F 1/20; G06F 2200/201; H01L 39/04; H01L 39/24
See application file for complete search history.

(56) References Cited

U.S. PATENT DOCUMENTS

| | | | |
|---|---|---|---|
| 4,485,640 | A | 12/1984 | Bon Mardion et al. |
| 5,347,819 | A | 9/1994 | Saji et al. |
| 9,779,360 | B2 | 10/2017 | Bunyk et al. |
| 2009/0007573 | A1 | 1/2009 | Noonan et al. |
| 2011/0120147 | A1 | 5/2011 | Shino |
| 2014/0137571 | A1* | 5/2014 | Petroff ............... B01D 8/00 62/55.5 |
| 2014/0326001 | A1* | 11/2014 | Citver ............... B01D 8/00 62/55.5 |
| 2017/0284725 | A1 | 10/2017 | Wikus et al. |
| 2018/0112928 | A1* | 4/2018 | Dorr ................ H01L 23/3677 |
| 2019/0042968 | A1* | 2/2019 | Lampert .............. H01L 23/34 |

OTHER PUBLICATIONS

Lane et al., "A superfluid-tunable 3D transmon qubit" thermalizaarXiv: 1907.07730v1 [quant-ph] Jul. 17, 2019. 9 pages.
Barenghi et al., Experiments on ions trapped below the surface of superfluid 4He J. Phys. C: Solid State Phys. 19 (1986) 1135-1144. Printed in Great Britain, (Oct. 1985). 10 pages.
International Search Report and Written Opinion received for PCT Application Serial No. PCT/EP2020/073941 dated Dec. 11, 2020, 14 pages.
Michael A Green, "The integration of liquid cryogen cooling and cryocoolers with superconducting electronic systems", Superconductor Science and Technology, Supercond. Sci. Technol, Jan. 1, 2003, 12 pages.
Daley A J et al., "Single Atom Cooling by Superfluid Immersion: A Non-Destructive method for Qubits", Arxiv.org, Cornell University Library, 201 Olin Library Cornell University Ithaca, NY 14853, Aug. 25, 2003, 16 pages.
Krinner et al., "Engineering cryogenic setups for 100-qubit scale superconducting circuit systems", EPJ Quantum Technology vol. 6, No. 1, May 28, 2019, 29 pages.
Taylor et al., "An Efficient Cooling Loop for Connecting Cryocooler to a Helium Reservoir", AIP Conference Proceedings vol. 710, Jan. 1, 2004, 10 pages.

* cited by examiner

USING THERMALIZING MATERIAL IN AN ENCLOSURE FOR COOLING QUANTUM COMPUTING DEVICES

BACKGROUND

The subject disclosure relates to quantum computing devices, and more specifically, to cooling quantum computing devices.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, devices, systems, methods, and computer-implemented methods are described that can facilitate using thermalizing material in an enclosure for cooling quantum computing devices.

According to an embodiment, a system can comprise a quantum computing device disposed within an enclosure. The system can further comprise a thermalizing material further disposed within the enclosure, and the thermalizing material can be adapted to thermally link a cryogenic device to the quantum computing device.

According to an embodiment, in the system, the enclosure containing the thermalizing material and the quantum computing device can be coupled to the cryogenic device. In an alternative embodiment, in the system, instead of being affixed to the cryogenic device, the enclosure can be a part of the cryogenic device, e.g., formed as a part of a cryogenic plate. In some implementations, the cryogenic device can be a cryostat.

In this system, the enclosure can be sealed to be leak-tight to contain a liquid thermalizing material. Further, in some implementations, the liquid thermalizing material can be adapted to thermally link the cryogenic device to the quantum computing device by immersing the quantum computing device in the liquid thermalizing material. An example liquid thermalizing material that can be used by one or more embodiments is superfluid helium.

In an alternative embodiment, the thermalizing material can be a solid thermalizing material adapted to thermally link the cryogenic device to the quantum computing device by contact with the quantum computing device. An example solid thermalizing material discussed below, that can be used by one or more embodiments is pressurized helium.

In some additional embodiments of the system, the enclosure can include an opening to facilitate the providing of the thermalizing material into the enclosure. One approach to facilitating this providing that can be used by one or more embodiments can use a one-piece hollow body (e.g., a pipe) to define a fluid path into the enclosure. To further facilitate this providing, a valve disposed in an opening in the disclosure can be coupled to the one-piece hollow body.

In one or more embodiments, the fluid path defined by the one-piece hollow body can traverse multiple stages of the cryogenic device, e.g., to facilitate adding thermalizing material to the enclosure from a room temperature environment. Further, after sufficient thermalizing material has been added, the valve can be closed, and excess thermalizing material can be removed from the one-piece hollow body, e.g., removed to the room temperature environment.

In another feature of the system embodiment, the enclosure can comprise a connection to interact with the quantum computing device. For example, in some implementations the connection can be a hermetic microwave feedthrough into the enclosure. In an alternative or additional embodiment, the connection can be a direct current (DC) connection with the quantum computing device.

In another embodiment, a method can comprise forming an enclosure and disposing a quantum computing device within the enclosure. The method can further comprise providing a thermalizing material into the enclosure with the quantum computing device, and the thermalizing material can be adapted to thermally link a cryogenic device to the quantum computing device. Further embodiments of the method can comprise coupling the enclosure to the cryogenic device.

In these embodiments, the method can further comprise coupling a one-piece hollow body defining a fluid path to a valve disposed in an opening in the enclosure, and the providing of the thermalizing material into the enclosure employs the one-piece hollow body and the valve in an open state. In additional embodiments, the method can comprise changing the valve to be in a closed state and evacuating excess thermalizing material from the one-piece hollow body. The method can further comprise an arrangement where the one-piece hollow body can traverse multiple temperature stages of the cryogenic device, the evacuating the excess thermalizing material from the one-piece hollow body can prevent a thermal short between two or more of the multiple temperature stages, potentially based on this traversal.

To facilitate access to the quantum computing device, the method can further comprise, connecting a microwave source to the quantum computing device via a cryogenic connector into the enclosure. In an additional or alternative embodiment, the method can further comprise connecting a direct current source to the quantum computing device via a feedthrough into the enclosure.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It should be appreciated that the embodiments of the subject disclosure depicted in various figures disclosed herein are for illustration only, and as such, the architecture of such embodiments are not limited to the systems, devices, and/or components depicted therein.

Quantum computing is generally the use of quantum-mechanical phenomena for the purpose of performing computing and information processing functions, e.g., quantum computing can employ quantum physics to encode and process information, rather than binary digital techniques based on transistors. That is, while classical computers can operate on bit values that are either 0 or 1, quantum computers operate on quantum bits that (qubits) that can comprise superpositions of both 0 and 1, can entangle multiple quantum bits (qubits), and use interference to affect other qubits. Quantum computing has the potential to solve problems that, due to their computational complexity, cannot be solved, either at all or for all practical purposes, by a classical computer.

The superposition principle of quantum physics can facilitate allowing qubits to be in a state that partially represent both a value of "1" and a value of "0" at the same time. The entanglement principle of quantum physics can facilitate allowing qubits to be correlated with each other such that the combined states of the qubits cannot be factored into individual qubit states. For instance, a state of a first qubit can depend on a state of a second qubit. As such, a quantum circuit can employ qubits to encode and process information in a manner that can be significantly different from binary digital techniques based on transistors.

Figure 1:
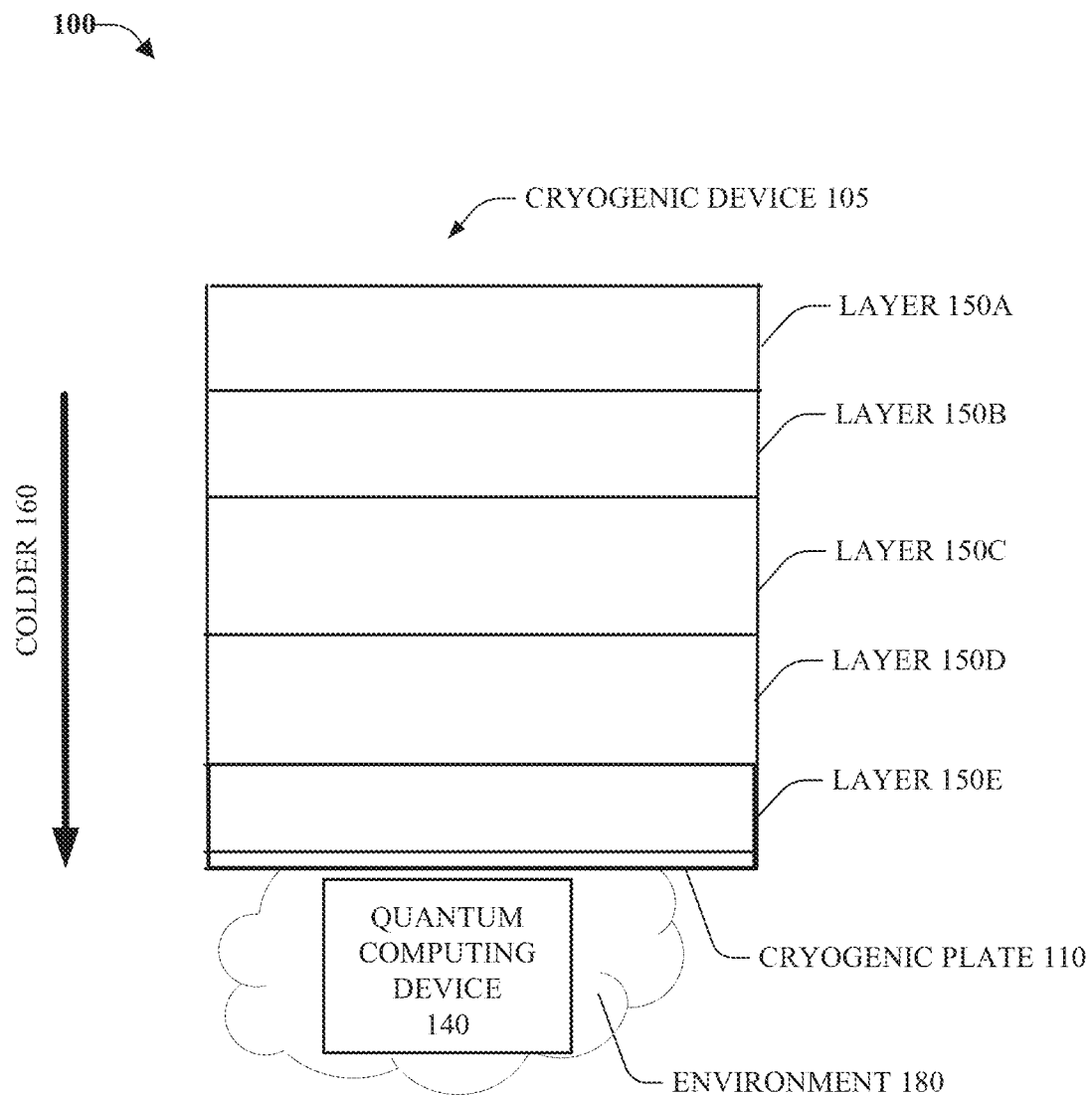
FIG. 1 illustrates a side view of example, non-limiting devices that can establish and maintain stability aspects of an environment for the operation of a quantum computing device, in accordance with one or more embodiments described herein.

FIG. 1 illustrates a side view of example, non-limiting devices 100 that can establish and maintain stability aspects of environment 180 for the operation of quantum computing device 140, in accordance with one or more embodiments described herein. Repetitive description of like elements and/or processes employed in respective embodiments is omitted for sake of brevity. In one or more embodiments, devices 100 can include cryogenic device 105 that can establish and maintain temperature conditions of environment 180 for the operation of quantum computing device 140. In some embodiments, cryogenic device 105 can include layers 150A-E, with layer 150E coupled to cryogenic plate 110. Other layers may also be coupled to cryogenic plates, not shown in FIG. 1. In embodiments, the temperature of environment 180 can be altered by thermic exposure to cryogenic plate 110.

As noted above, some implementations of quantum computing devices 140 can require particular conditions of environment 180 to be maintained for operation, one of these conditions being a cryogenic environment, e.g., a cold environment can reduce unwanted instability based on excitation of the qubit states of quantum computing device 140.

According to multiple embodiments, quantum computing device 140 can comprise one or more quantum computing devices including, but not limited to, a quantum computer, a quantum processor, a quantum simulator, quantum hardware, a quantum chip (e.g., a superconducting circuit fabricated on a semiconducting device), one or more qubits of a quantum chip, and/or another quantum computing device.

Operating quantum computing device 140 in an unstable thermal environment can limit the operation of the devices, e.g., by limiting the coherence time of qubits of the device. As described further below, one or more embodiments can improve the operation of quantum computing devices by improving the thermal stability of the devices. One approach that can be used by one or more embodiments to achieve these benefits can increase the exposure of qubits to cryogenic cooling, e.g., by mounting quantum computing device 140 an enclosure filled with a thermally conductive material.

As used herein, cryogenic device 105 is a general term for current and future devices that can, potentially in different ways, provide a cryogenic environment 180 for the operation of quantum computing device 140. Example cryogenic devices 105 that can be used by one or more embodiments can include, but are not limited to, a cryostat device, a cryogenic refrigerator device, and a dilution refrigerator device.

In some implementations, cryogenic device 105 can comprise two or more layers of cooling elements can be combined to incrementally cool the environment (e.g., becoming colder 160 when traversing from layers 150A-E), until, at a layer (e.g., layer 150E), a cryogenic environment 180 can result, which can be used to thermalize quantum computing device 140. In an example, as depicted, coldest layer 150E is adjacent and thermally coupled to cryogenic plate 110. In some embodiments, cryogenic plate 110 can comprise International Organization for Standardization (ISO) 100 plates. In some embodiments, when, as depicted in FIG. 2, cryogenic device 105 comprises a dilution refrigerator, coldest layer 150E can comprise a mixing chamber, and cryogenic plate 110 can comprise a mixing chamber plate.

Figure 2:
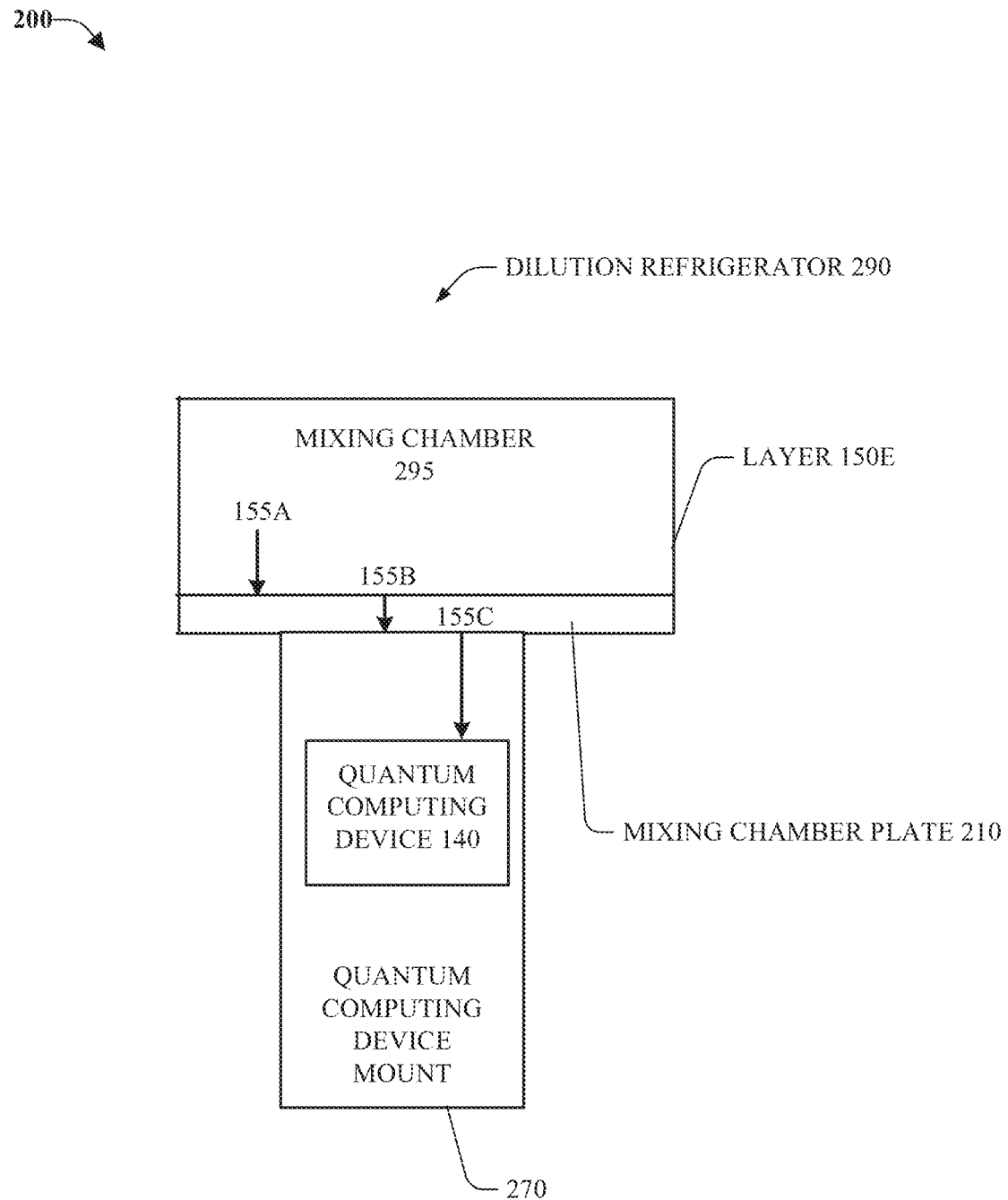
FIG. 2 illustrates a side view of example, non-limiting devices that can establish and maintain stability aspects of the environment for the operation of the quantum computing device, in accordance with one or more embodiments described herein.

FIG. 2 illustrates a side view of example, non-limiting devices 200 that can establish and maintain stability aspects of environment 180 for the operation of quantum computing device 140, in accordance with one or more embodiments described herein. Repetitive description of like elements and/or processes employed in respective embodiments is omitted for sake of brevity. In one or more embodiments, devices 100 can include dilution refrigerator 290 coupled to quantum computing device mount 270.

In some implementations of dilution refrigerator 290, mixing chamber plate 210 has characteristics similar to cryogenic plate 110. In multiple embodiments, to provide cooling to quantum computing device 140, quantum computing device mount 270 can be adapted to mount to mixing chamber plate 210. Examples of different implementations of quantum computing device mount 270 are discussed with FIGS. 3-6 below.

Continuing this example, in one or more embodiments, the mounting of quantum computing device mount 270 to mixing chamber plate 210 can thermally link quantum computing device mount 270 to mixing chamber plate 210, and further to mixing chamber 295. In this example, layer 150E can thermalize cryogenic plate 110, which in turn can thermalize elements disposed on cryogenic plate 110, e.g., quantum computing device mount 270. In example embodiments discussed below, cryogenic plate 110 can be maintained at 10 millikelvins (mK) by the operation of layer 150E.

Considering the thermalization process in greater detail, in one or more embodiments, as depicted by thermal influence 155A, mixing chamber 295 can cool mixing chamber plate 210. Based on the thermal conductivity of mixing chamber plate 210, as depicted by thermal influence 155B, mixing chamber plate 210 can thermally influence quantum computing device mount 270. In an example, this mount can be comprised of copper bottom cover affixed to mixing chamber plate 210. Quantum computing device 140 can, in some implementations, be mounted on the copper bottom. Other types of mounts are described with embodiments below.

Returning to the thermalization process, in one or more embodiments, the temperature of mixing chamber plate 210 can remove heat from quantum computing device mount 270, eventually causing the temperatures of these components to be equal, e.g., the components being in a thermal equilibrium. It should be noted however, that having quantum computing device mount 270 be at a selected temperature does not ensure that quantum computing device 140 mounted within quantum computing device mount 270 will be at the same temperature. FIGS. 2-5 below depict different approaches to thermally linking layer 150E to a quantum computing device, in accordance with one or more embodiments.

Figure 3:
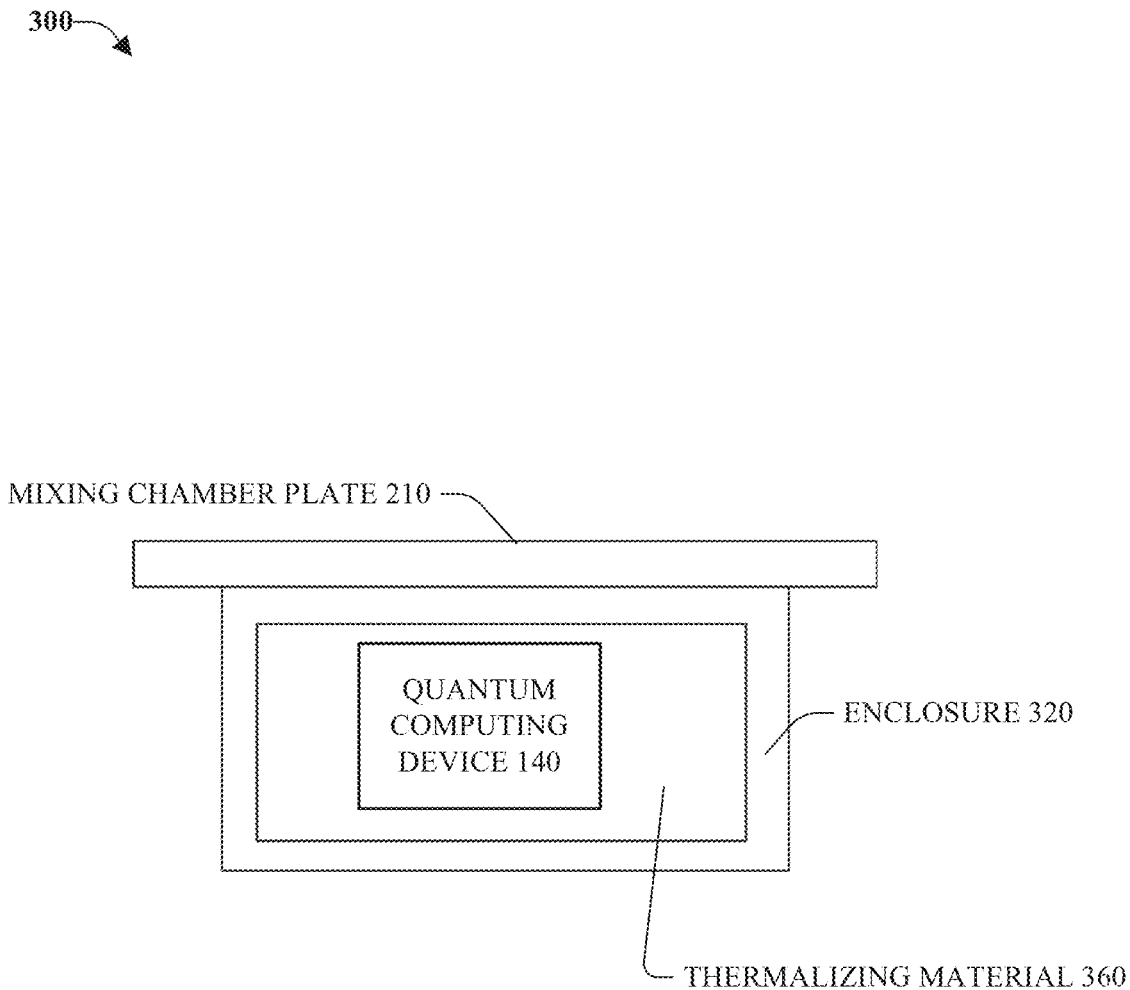
FIG. 3 illustrates a side view of an example, non-limiting device that can facilitate using thermalizing material in an enclosure for cooling quantum computing devices, in accordance with one or more embodiments described herein.

FIG. 3 illustrates a side view of example, non-limiting device 300 that can establish and maintain stability aspects of environment 180 for the operation of quantum computing device 140, in accordance with one or more embodiments described herein. Repetitive description of like elements and/or processes employed in respective embodiments is omitted for sake of brevity. In one or more embodiments, devices 100 can include enclosure 320 affixed to mixing chamber plate 210. In some embodiments, enclosure 320 can enclose quantum computing device 140 and thermalizing material 360.

It should be noted that, although in one or more embodiments described herein enclosure 320 is described as affixed to mixing chamber plate, this characterization is non-limiting, and these elements can be placed in proximity by many ways, including, but not limited to, coupled, thermally coupled, glued, fastened, attached, and mechanically coupled. Many of these approaches are described with FIG. 4 below, including an embodiment where the enclosure 320 structure is formed as a part of mixing chamber plate 210. It should further be noted that, because enclosure 320 is affixed to cryogenic device 105, enclosure 320 can also be termed a cryogenic enclosure, in one or more embodiments.

Generally speaking, as depicted in FIG. 3, one or more embodiments can maintain a stable environment 180 for the operation of quantum computing device 140 by enclosing quantum computing device 140 in enclosure 320, and affixing enclosure 320 to a cold reservoir, e.g., mixing chamber plate 210. Enclosure 320 can be filled with thermalizing material 360 such that this material contacts quantum computing device 140 and enclosure 320. In a process that can thermalize quantum computing device 140, in one or more embodiments, mixing table plate 210 can, as a cold reservoir in contact with enclosure 320, remove heat from this enclosure 320, which in turn removes heat from thermalizing material 360 and subsequently directly from quantum computing device 140.

Figure 7:
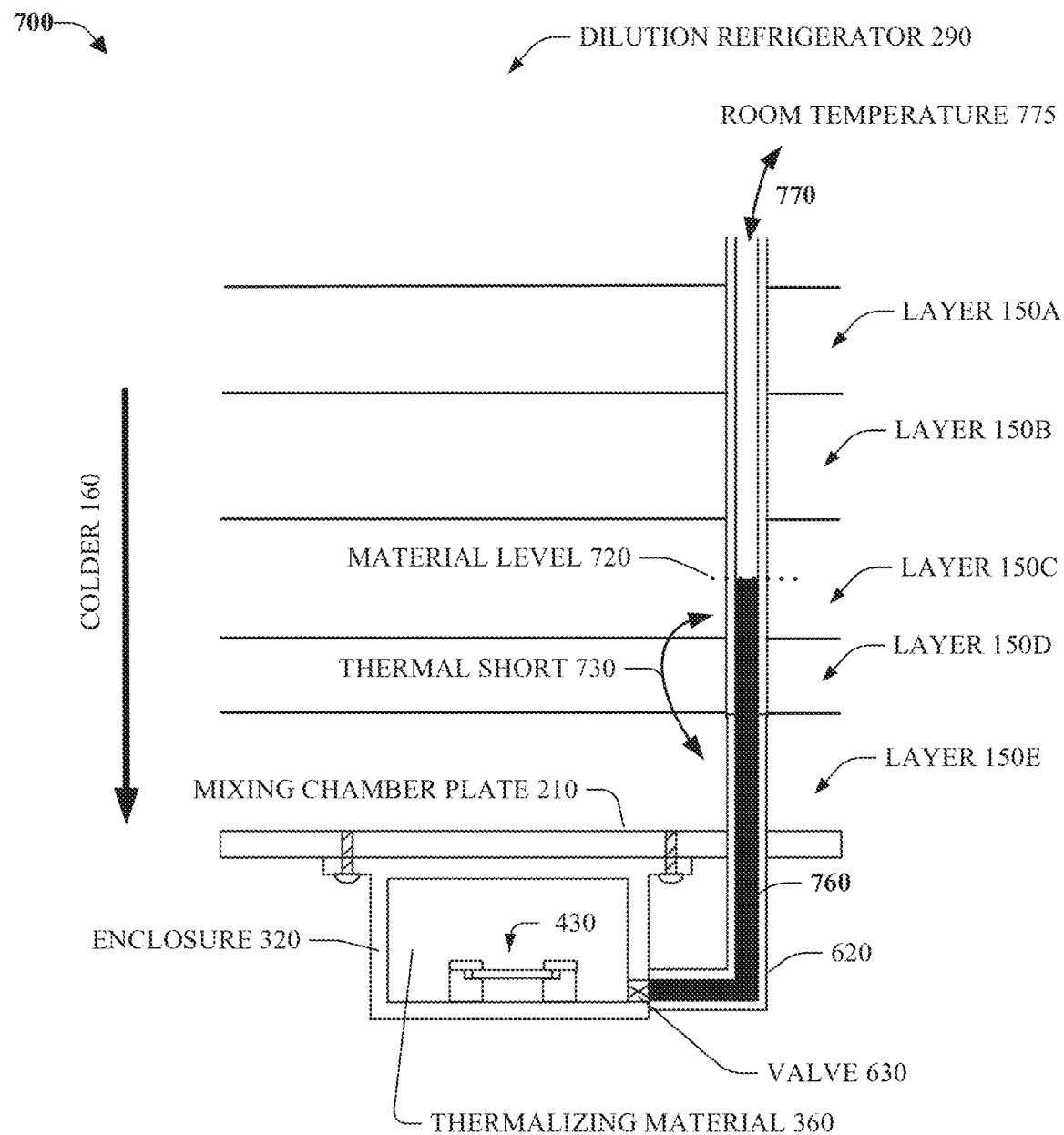
FIG. 7 illustrates a side view of example, non-limiting devices that can facilitate egressing thermalizing material from an enclosure for cooling quantum computing devices, in accordance with one or more embodiments described herein.
Figure 8:
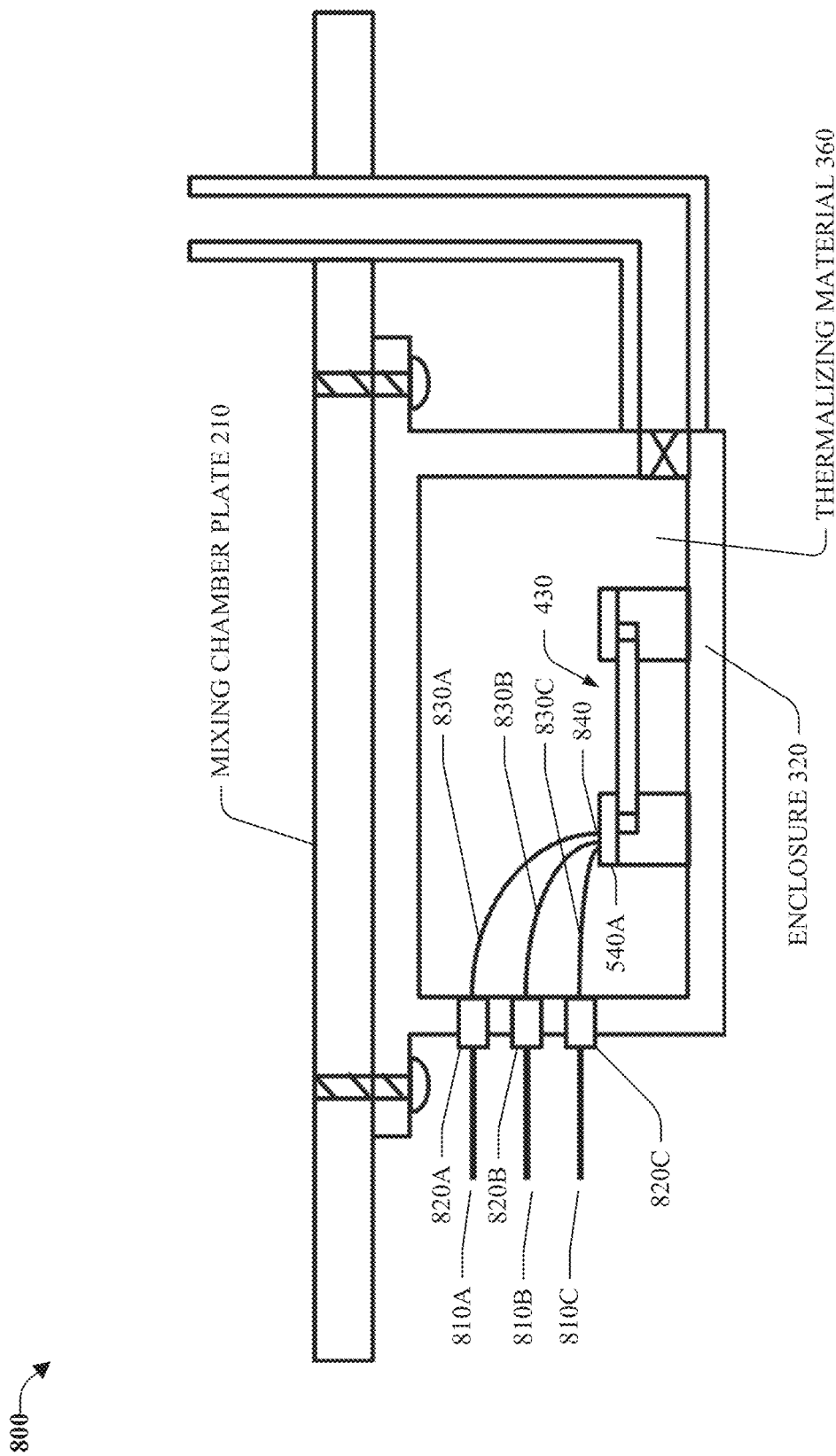
FIG. 8 illustrates a top view of an example, a non-limiting system that can facilitate the establishing of signal lines from outside of an enclosure to a quantum computing device inside the enclosure, in accordance with one or more embodiments described herein.

This approach can increase thermalization of quantum computing device 140 at least based on the contact between thermalizing material 360 and quantum computing device 140 inside enclosure 320. Additional details, and variations of this general approach are described with FIGS. 4-5 below. Example embodiments of the providing of the thermalizing material 360 into enclosure 320 are described with FIGS. 6-7 below, and a discussion of FIG. 8 provides example approaches to establishing signal lines to quantum computing device 140 within enclosure 320.

Figure 4:
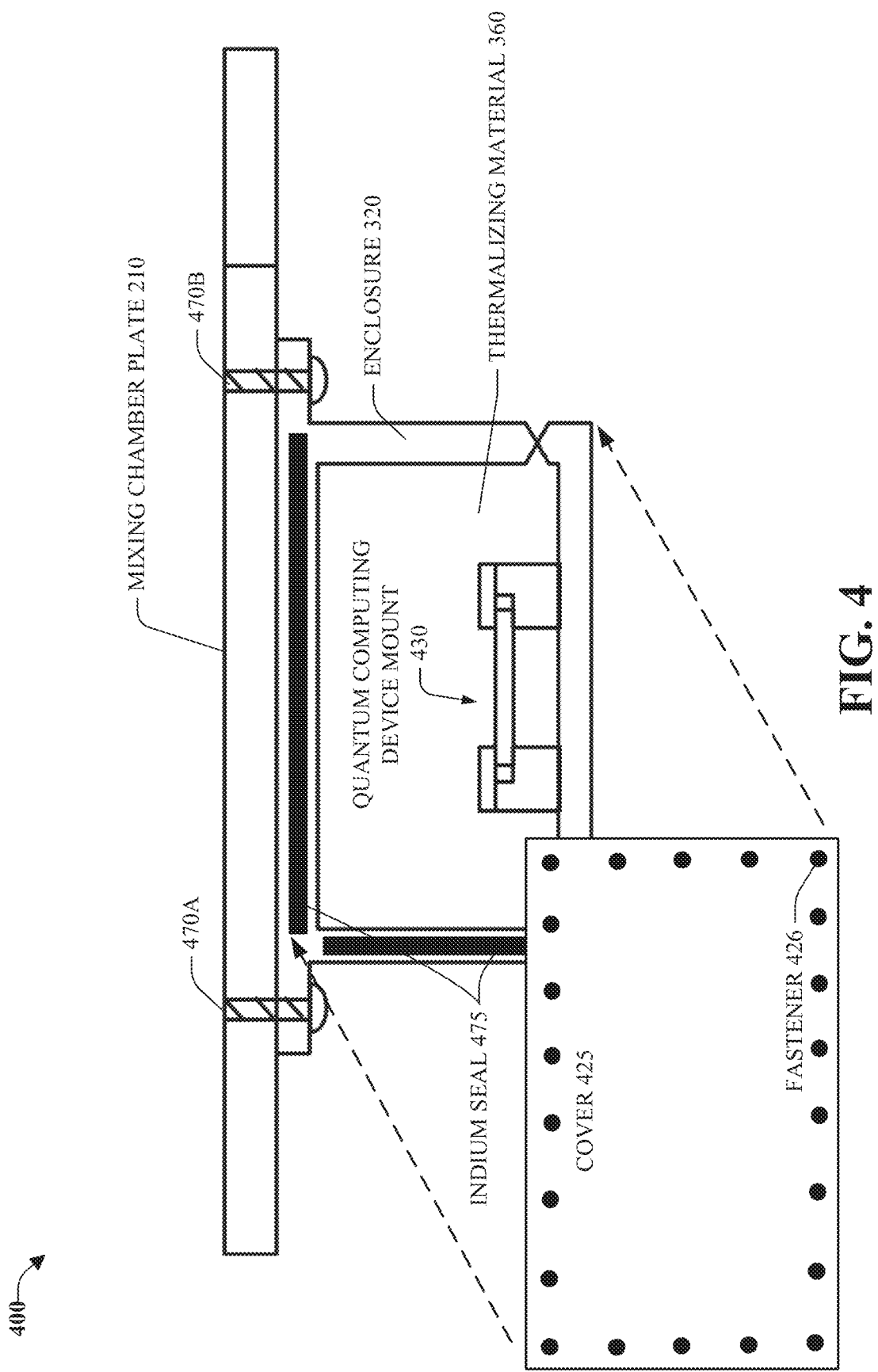
FIG. 4 illustrates a side view of example, non-limiting devices that can facilitate using thermalizing material in an enclosure for cooling quantum computing devices, in accordance with one or more embodiments described herein.
Figure 5:
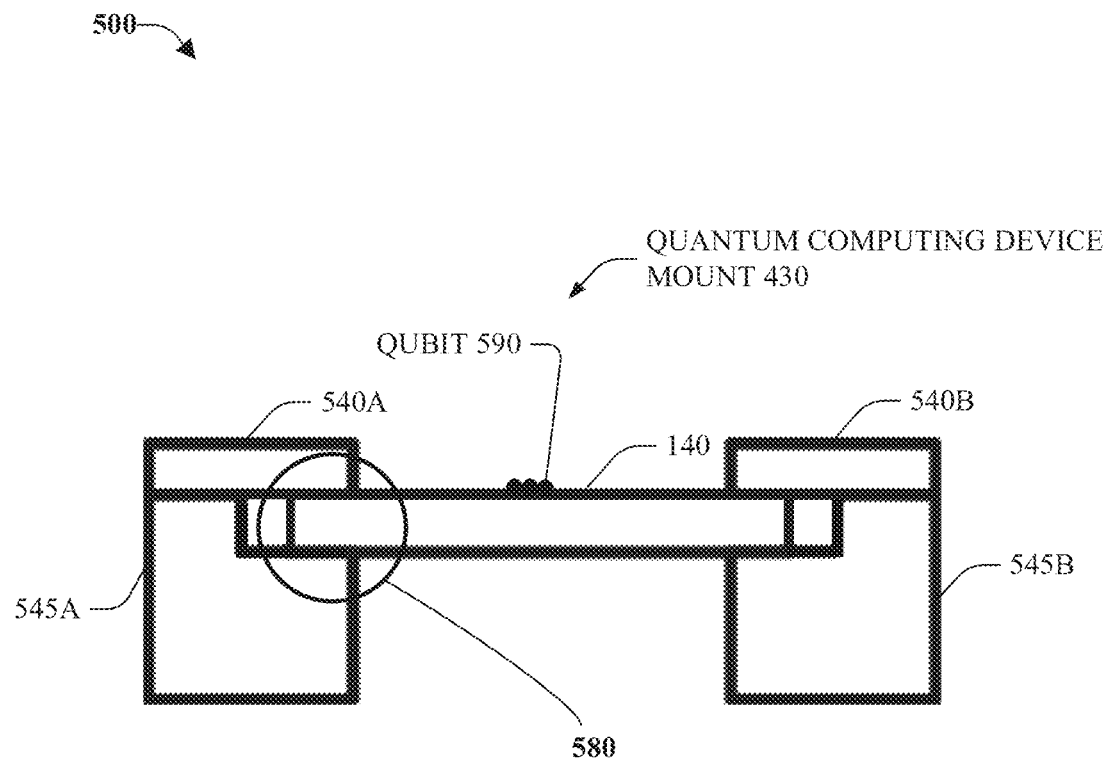
FIG. 5 illustrates a side view of example, non-limiting devices that can facilitate using thermalizing material in an enclosure for cooling quantum computing devices, in accordance with one or more embodiments described herein.

FIGS. 4-5 provide a more detailed description of the general approaches described above, with FIG. 4 focusing on details of enclosure 320 and thermalizing material 360, and FIG. 5 describing one or more embodiments of quantum computing device mount 430, this mount being adapted in several ways to beneficially orient quantum computing device 140 inside enclosure 320, in contact with thermalizing material 360.

FIG. 4 illustrates a cross-sectional side view of example, non-limiting devices 400 that can establish and maintain stability aspects of environment 180 for the operation of a quantum computing device, in accordance with one or more embodiments described herein. Repetitive description of like elements and/or processes employed in respective embodiments is omitted for sake of brevity. In one or more embodiments, devices 400 can include enclosure 320 affixed to mixing chamber plate 210 by fasteners 470A-B and cover 425 to seal enclosure 320. In many embodiments, enclosure 320 can include quantum computing device mount 430 that secures quantum computing device 140 inside enclosure 320. FIG. 5 depicts one or more embodiments of quantum computing device mount 430 securing quantum computing device 140, along with details of different embodiments of quantum computing device 430 mount.

As depicted in FIG. 4, in one or more embodiments, to receive thermal influence from mixing chamber plate 210, enclosure 320 can be affixed to mixing chamber plate 210. Although fasteners 470A-B are depicted, it should be appreciated that other ways can be employed to affix enclosure 320 to mixing chamber plate 210, including adhesives or the use of more than two fasteners. In an alternative embodiment, instead of being a device separate from mixing chamber plate 210, enclosure 320 can be integrally formed as a part of mixing chamber plate 210.

In some embodiments, one or more elements of the various embodiments described of illustrated herein can be fabricated using various materials. For example, the various embodiments of enclosure 320, quantum computing device 140, quantum computing device mount 270, and components thereof described herein or illustrated in the figures can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for enclosure 320 as well as other elements described below.

In one or more embodiments, enclosure 320 can be composed of different materials, these materials being selected based on factors including, but not limited to, a capacity to contain the material selected as thermalizing material 360, the thermal conductivity of the material, and the characteristics of the material under the conditions of the required operating environment 180 for quantum computing device 140. An example material that can be employed with one or more embodiments is copper, but this is non-limiting, and other materials can be selected.

Turning to the characteristics and composition of thermalizing material 360, in one or more embodiments, to remove heat from quantum computing device 140, different types and different amounts of thermalizing material 360 can be placed inside enclosure 320. In one or more embodiments, thermalizing material 360 can be adapted to thermally link a cryogenic device to quantum computing device 140. For example, mixing chamber plate 210, as a reservoir of cold from a cryogenic device 105 (e.g., dilution refrigerator 290), can thermally influence quantum computing device 140 mounted in quantum computing device mount 270. Different embodiments that describe this thermal influence, including the interaction between thermalizing material 360 and quantum computing device 140 are included with the discussion of FIG. 5 below.

One having skill in the relevant art(s), given the description herein, would appreciate that different materials can be used as thermalizing material 360. Superfluid helium, is an example of a thermalizing material 360 that can be employed by one or more embodiments described herein. Different compositions of superfluid helium can be employed, including, but not limited to 3He, 4He, or a 3He/4He mixture. It would be appreciated by one having skill in the relevant art(s), given the description herein, that thermalizing material 360 can be selected for use by one or more embodiments, based on factors including, but not limited to, the thermal conductivity of the material, and the characteristics of the material under the conditions of the required operating environment 180 for quantum computing device 140. In addition to the types of superfluid helium discussed above, materials that can also be employed individually or in combination as thermalizing material 360 can include, but are not limited to: argon, xenon, nitrogen, and non-superfluid helium. One having skill in the art would appreciate that different thermalizing materials are suitable for use with different types of cryogenic device 105.

Materials usable as thermalizing material 360 can also broadly include materials in different states, including, a liquid state and a solid state. It would further be appreciated that, different elements of embodiments described herein would be modified and adapted to add, contain, and remove thermalizing material 360, based on the state in which the material is employed.

Figure 6:
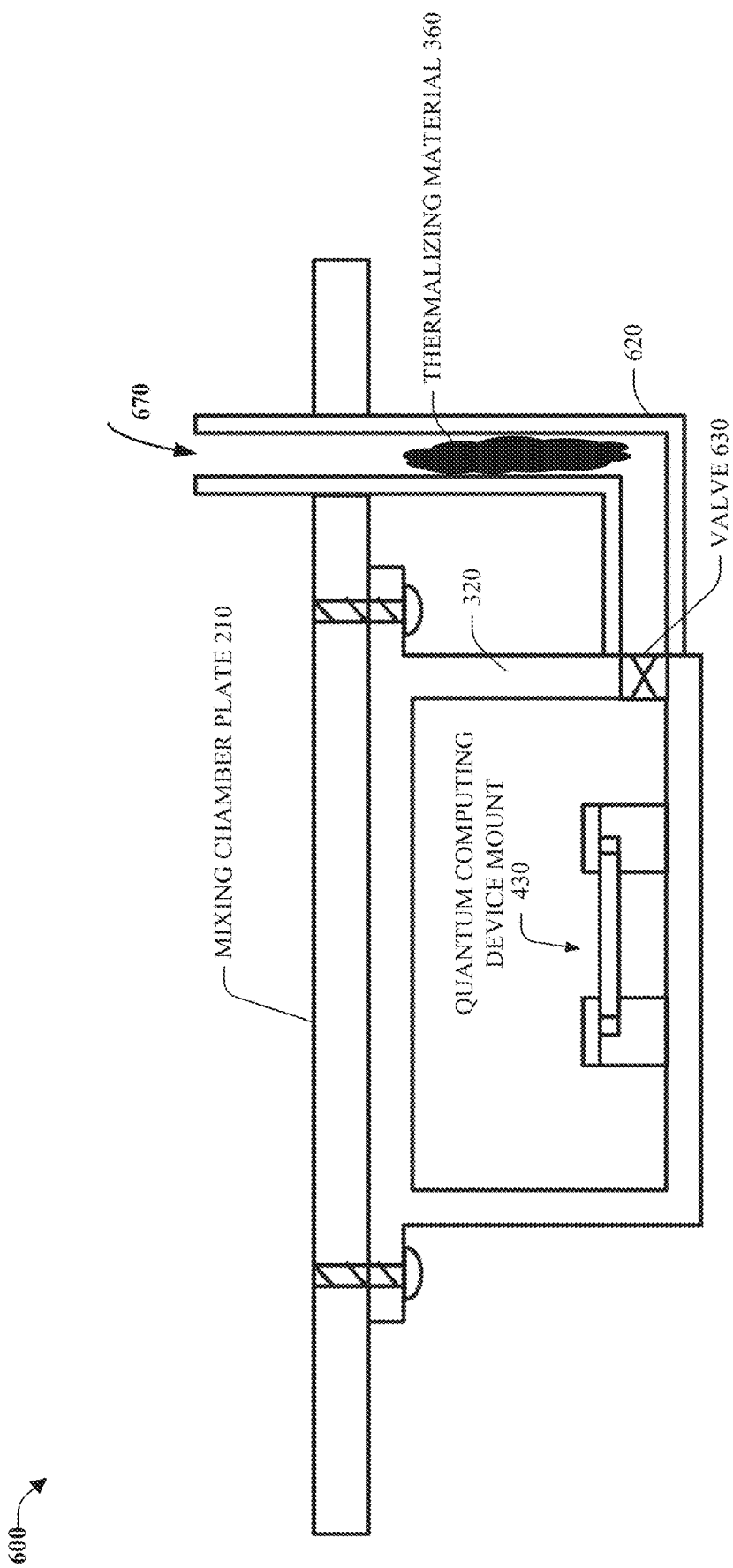
FIG. 6 illustrates a side view of example, non-limiting devices that can facilitate providing thermalizing material into an enclosure for cooling quantum computing devices, in accordance with one or more embodiments described herein.

For an example where thermalizing material 360 is in a liquid state, one having skill in the relevant art(s), given the description herein, would appreciate that, to facilitate containing the liquid thermalizing material 360, enclosure 320 can be sealed with a leak tight seal, that can be sustained under a pressure required to maintain thermalizing material 360 in a selected state. In addition, selected approaches can be used for providing and egressing liquid thermalizing material 360 in to and out of enclosure 320. FIGS. 6-7 below provide detailed examples of different approaches to handling thermalizing martial 360, that can be employed by one or more embodiments.

In an alternative example, a solid thermalizing material 360 can be used. Materials that can be used as a solid thermalizing material include, but are not limited to, pressurized 4He or 3He. In one or more embodiments, a solid thermalizing material 360 can be placed within enclosure 320 and not be subject to movement based on shock or movement of enclosure 320. In alternative embodiments, liquid thermalizing material 360 can, in one or more embodiments, fill up enclosure 320 such that large movements in the material could be prevented.

Returning to a discussion of FIG. 4, in one or more embodiments, enclosure 320 can be closed and sealed by cover 525, this being, in some embodiments, composed of thermally conductive materials similar to materials selected for enclosure 320, e.g., copper. To be affixed to enclosure 320, cover 425 can, in some embodiments, be secured with fasteners (e.g., fastener 426). In addition, as noted above, to contain thermalizing material 360 in different states, enclosure 320 can be required to be sealed and leak tight. Different approaches to sealing cover 425 on enclosure 320 can be employed, with a non-limiting example being indium seal 475. It should be noted that, for illustrating convenience, indium seal 475 is depicted irregularly applied to enclosure 320. In a preferred embodiment, indium seal 475 can form a continuous ring, and can be pressed between a surface of enclosure 320 and a surface of cover 425. In one or more embodiments, cover 425 can be circular in shape, and further can be used to seal one or more of any side of enclosure 320.

FIG. 5 illustrates a side view of example, non-limiting devices 500 that can establish and maintain stability aspects of environment 180 for the operation of quantum computing device 140, in accordance with one or more embodiments described herein. Repetitive description of like elements and/or processes employed in respective embodiments is omitted for sake of brevity. In one or more embodiments, devices 400 can include quantum computing device mount 430 with quantum computing device 140 secured thereto.

Quantum computing device mount 430 can include holders 545A-B, portions of circuit boards 540A-B, and quantum computing device 140. It should be appreciated that one or both of holders 545A-B and circuit boards 540A-B can wrap around edges of quantum computing device 140, and the two-dimensional cross-section of devices 400 does not depict these parts.

In one or more embodiments, certain aspects of the design of quantum computing device mount 430 are adapted to improve the thermal link between quantum computing device 140 and mixing chamber plate 210. Specifically, one or more embodiments can be adapted to reduce Kapitza resistance, which scales inversely with the interface area between two materials. In this example, the two materials between which thermal resistance is further reduced is thermalizing material 360 and quantum computing device 140, in accordance with one or more embodiments. To this end, in one or more embodiments, quantum computing device mount 430 and the use of thermalizing material 360 have several useful characteristics, discussed below.

In an example embodiment where thermalizing material 360 is in a liquid state, this liquid can fill enclosure 320 such that quantum computing device 140 is partially or completely immersed by the liquid thermalizing material. It can be noted that, in the embodiment depicted, quantum computing device mount 430 is formed so as to maximize exposure to liquid thermalizing material 360. For example, it can be appreciated that both sides of quantum computing device 140 are exposed. This contrasts with the approach discussed with FIG. 2 above, where quantum computing device 140 is mounted with only one side exposed to mixing chamber plate 210, e.g., the approach of FIG. 5 comparatively reduces Kapitza resistance by almost doubling the exposed surface area of quantum computing device 140.

Another feature to this end is that holders 545A-B and circuit boards 540A-B are formed such that the amount of surface area required to secure quantum computing device 140 is reduced as compared to other approaches, e.g., an example discussed with FIG. 2 above. For example, label 580 highlights a part of quantum computing device mount 430 where the exposure of a small portion of quantum computing device 140 is blocked to secure the device.

Another aspect of one or more embodiments that can be facilitated by the approach of FIGS. 4-5, is that qubits (e.g., qubit 590) on an exposed surface of quantum computing device 250 can directly contact liquid thermalizing material 360. In some circumstances this direct contact with qubit 590 can facilitate increased thermalization of qubits.

FIG. 6 illustrates a side view of example, non-limiting devices 600 that can employ enclosure 320 and thermalizing material 360 to establish and maintain stability aspects of environment 180 for the operation of quantum computing device 140, in accordance with one or more embodiments described herein. Repetitive description of like elements and/or processes employed in respective embodiments is omitted for sake of brevity. Devices 600 can include enclosure 210 affixed to mixing chamber plate 210.

Enclosure 320 includes quantum computing device mount 430 and thermalizing material 360 therein, and contains an opening with a valve 630 that can control a flow of liquid. Coupled to enclosure 320 at valve 630, one-piece hollow body 620 defines a fluid path through mixing chamber plate 210.

In one or more embodiments, thermalizing fluid 360 can be provided into, and egressed out of, enclosure 320 via hollow body 620, with valve 630 facilitating the traversing of material in and out of enclosure 320. Thus, to initially fill or add additional thermalizing material 360 to enclosure 320, valve 630 can be opened and thermalizing material 360 can be added at label 670. It should be noted that, in one or more embodiments, thermalizing material can be added and removed through hollow body 620 in a room temperature environment. In one or more embodiments, hollow body 620 can further be used to control the pressure in enclosure 320.

With respect to the providing and egressing of thermalizing material 360, it should be noted that the material and state of the thermalizing material may not be able to flow through hollow body 620, and different approaches can be used, e.g., removal of cover 425 of enclosure 320, described above.

FIG. 7 illustrates a side view of example, non-limiting devices 700 that can employ enclosure 320 and thermalizing material 360 to establish and maintain stability aspects of environment 180 for the operation of quantum computing device 140, in accordance with one or more embodiments described herein. Repetitive description of like elements and/or processes employed in respective embodiments is omitted for sake of brevity. Devices 600 can include enclosure 210 affixed to mixing chamber plate 210 attached to dilution refrigerator 290. Enclosure 320 includes quantum computing device mount 430 and thermalizing material 360 therein. As described with FIG. 1 above, dilution refrigerator 290 includes layers 150A-E, with traversal toward layer 150E being associated with a colder 160 environment.

As described with FIG. 6 above, in one or more embodiments, enclosure 320 can contain an opening with a valve 630 that can control a flow of liquid. Coupled to enclosure 320 at valve 630, one-piece hollow body 620 can define a fluid path. In this example, hollow body 620 traverses layers 150A-E from an opening 770 that is at room temperature 775.

When, as discussed with FIG. 6 above, thermalizing material 760 is added at opening 770, in some circumstances, due to enclosure 320 being filled with thermalizing material 360 or another reason, thermalizing material 760 can fill up hollow body 620. In example, material level 720 corresponds to an amount of thermalizing material 760 that, in this example, is filling hollow body 620. Further in this example, dilution refrigerator 290 is operating in a normal state, e.g., mixing chamber layer 150E reduces the temperature of mixing chamber plate 210 to an operational temperature for quantum computing device 140.

In one or more embodiments, because thermalizing material 760 has a high thermal conductivity, if thermalizing material 760 is left in hollow body 620 at material level 720, this can enable heat from a warmer layer (e.g., layer 150C) to be thermally influenced by materials of a colder 160 layer, e.g., layer 150E. This thermal interaction between levels of a dilution refrigerator 290 is termed a thermal short 730 and can deleteriously affect the operation of dilution refrigerator 290. One way that one or more embodiments can prevent this thermal short 730 is to, after employing valve 630 to prevent thermalizing material 760 from egressing from enclosure 360, remove excess thermalizing material 760 from hollow body 620, e.g., by suction or any other equivalent approach.

It should be noted that the various embodiments of elements discussed herein, including enclosure 320, quantum computing device 140, quantum computing device mount 270, and components thereof can provide technical improvements to systems, devices, components, operational steps, and/or processing steps associated with the various technologies identified above. For example, as discussed above, by immersing quantum computing device 140 in thermalizing material 360, one or more embodiments can increase the surface area of quantum computing device 140 that is in contact with thermalizing material 360. This increase in exposed surface area can improve the thermalization process by factors such as a reduction of thermal resistance.

FIG. 8 illustrates a top view of an example, non-limiting system 800 that can facilitate the establishing of signal lines 810A-C from outside of enclosure 320 to quantum computing device 140 inside enclosure 320, in accordance with one or more embodiments described herein. Repetitive description of like elements and/or processes employed in respective embodiments is omitted for sake of brevity. System 800 includes mixing chamber plate 210, and enclosure 320 having thermalizing material 360 and quantum computing device mount 430 therein. In one or more embodiments, enclosure 320 can include feedthrough access points 820A-C with signal lines 810A-C and internal access lines 830A-C connecting to circuit board 540A at connection point 840. Although for purposes of illustration only three signal lines 810A-C and three access points 820A-c are shown, it is possible to have more than three signal lines and access points to enclosure 320.

One or more embodiments can implement different approaches described herein with a configuration that attempts to maximize qubit cooling, while also enabling external connectivity to room temperature electronic components. Because in some embodiments, enclosure 320 can be hermetically sealed, approaches can be used to establish signal lines between external components, e.g., between room temperature electronics and supercooled quantum computer 140 inside sealed enclosure 320.

Example types of signals that can be used by one or more embodiments include, but are not limited to, signals encoded in direct current (DC) and microwave signals. In some embodiments, signal lines 810A-C and internal access lines 830A-C can comprise electrically conductive components through which electrical current and/or electrical signals can flow. For example, signal lines 810A-C and internal access lines 830A-C can comprise electrically conductive components including, but not limited to, wires, traces, transmission lines, resonant buses, waveguides, and/or other components through which electrical current can flow. In some embodiments, signal lines 810A-C and internal access lines 830A-C can be fabricated using materials including, but not limited to, copper, copper alloys (e.g., copper nickel), gold, platinum, palladium, gold alloys (e.g., gold palladium), brass, or any conductive metal or alloy, e.g., alternating current and/or direct current) and/or electrical signals (e.g., microwave signals) can be relayed thereby.

Some approaches employed by one or more embodiments can use cryogenic feedthroughs to carry signal lines into enclosure 320. For example, when microwave communication is implemented hermetic microwave feedthroughs 820A-C can be used. Example components that can be used by one or more embodiments are hermetic, cryogenic feedthrough connectors.

In some embodiments, the various approaches of one or more embodiments described herein can be associated with various technologies. For example, various embodiments described herein can be associated with cryogenic technologies, cryogenic refrigerator technologies, microwave signal carrier technologies, semiconductor fabrication technologies, printed circuit board technologies, quantum computing device technologies, quantum circuit technologies, quantum bit (qubit) technologies, circuit quantum electrodynamics (circuit-QED) technologies, quantum computing technologies, scalable quantum computing architecture technologies, surface code architecture technologies, surface code error correction architecture technologies, quantum hardware technologies, and/or other technologies.

Other technical improvements that can be provided by one or more embodiments described herein, are in areas of qubit coherence, that is, maintaining coherence in the qubits of quantum computing device 140 for as long as possible. As noted with the discussion of FIG. 5 above, because of the open design of some embodiments of quantum computing device assembly and the operation of thermalizing material 360 in enclosure 320, one or more qubits 490 programmed with quantum logic can be in contact with thermalizing material. In alternative approaches, qubits 490 received thermalization, potentially unpredictably, through additional structures and materials, e.g., thermalizing qubits 490 through quantum computing device mount 270 and the structural material of quantum computing device 140.

Additionally, in some embodiments, the approaches to communicating with quantum computing device described with FIG. 8 below, can provide technical improvements to a non-quantum processing unit associated with a quantum computing device, e.g., a quantum processor, quantum hardware etc. a circuit-QED system, and/or a superconducting quantum circuit. For example, as described above, one or more embodiments can provide an increased quantity of independent microwave signal transmission paths (e.g., feedthroughs 820A-C) that can be utilized to transmit microwave signals to quantum computing device 140. In this example, such quantum computing devices can comprise a quantum processor, and by providing independent microwave signals that can be transmitted to such a quantum processor, the device of the subject disclosure can facilitate improved performance of such a quantum processor (e.g., improved error correction, improved processing time, etc.).

In some embodiments, different implementations of quantum computing device 140 in enclosure 320 connected to conventional computer hardware and software can solve problems that are highly technical in nature, that are not abstract and that cannot be performed as a set of mental acts by a human. For example, as discussed above, the wired and wireless feedthrough approaches described above facilitate transmitting microwave signals and DC signals to a quantum computing device 140, in accordance with the embodiments described herein.

It is to be appreciated that one or more embodiments descried herein can utilize various combinations of electrical components, mechanical components, and circuitry that cannot be replicated in the mind of a human or performed by a human. For example, transmitting microwave signals to qubits 490 of quantum computing device 140 is greater than the capability of a human mind. For instance, the amount of data transmitted, the speed of transmitting such data, and/or the types of data transmitted using approaches described with FIG. 8, can be greater, faster, or different than the amount, speed, and/or data type that can be transmitted by a human mind over the same period of time.

Figure 9:
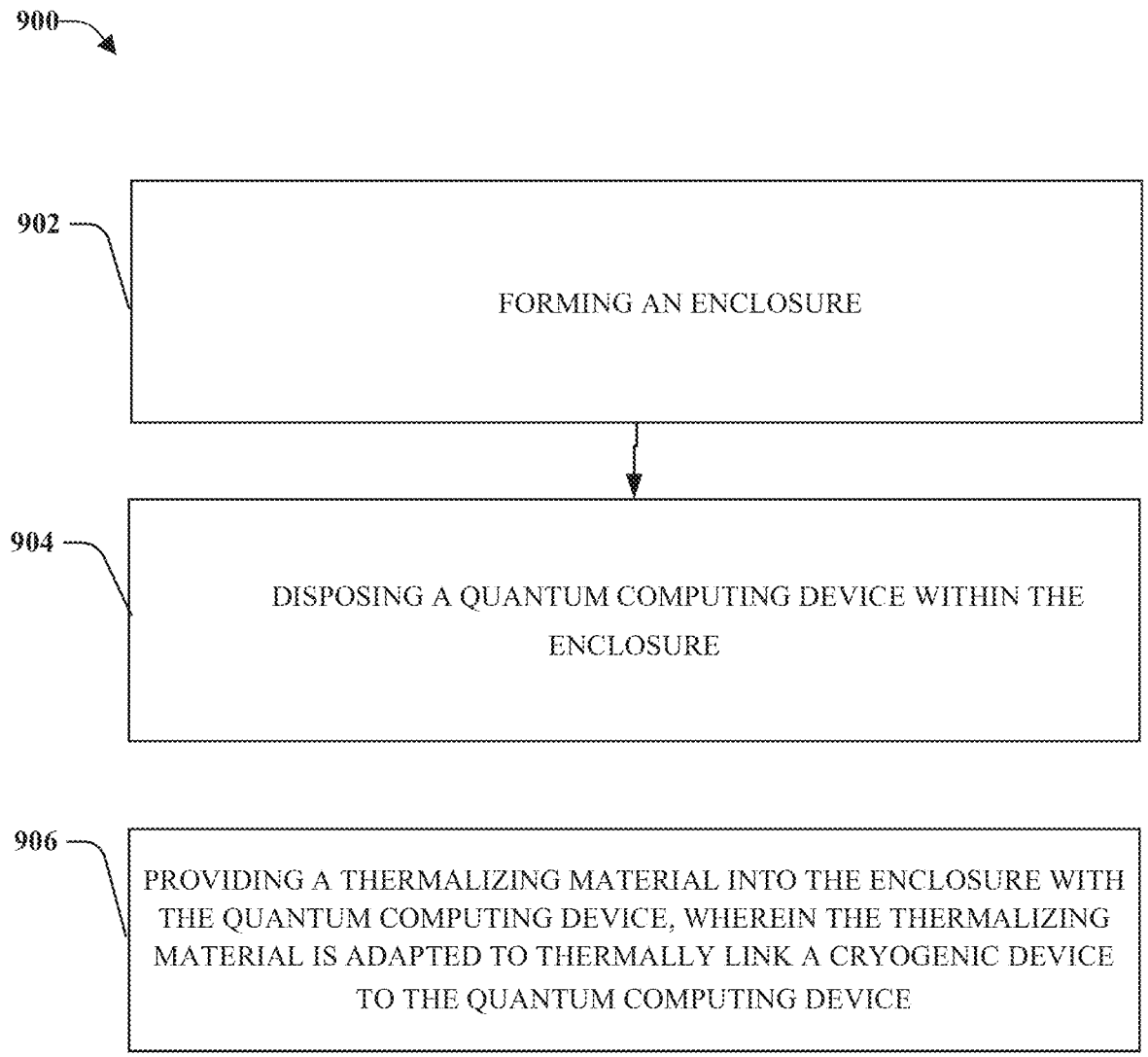
FIG. 9 illustrates a flow diagram of an example, non-limiting computer-implemented method that can facilitate employing thermalizing materials in an enclosure for quantum computing devices, in accordance with one or more embodiments described herein.

FIG. 9 illustrates a flow diagram of an example, non-limiting computer-implemented method 900 that can facilitate employing thermalizing materials in an enclosure for quantum computing devices, in accordance with one or more embodiments described herein. Repetitive description of like elements and/or processes employed in respective embodiments is omitted for sake of brevity.

In some embodiments, at 902, computer-implemented method 900 can comprise forming an enclosure. In an example, as described herein, an enclosure (e.g., enclosure 320) can be formed, for example, out of a thermo conductive material that can function in the operational environment 180 of quantum computing device 140, e.g., copper.

In some embodiments, at 904, computer-implemented method 900 can comprise disposing a quantum computing device within the enclosure. In an example, quantum computing device 140 can be disposed inside enclosure 320. In further embodiments, to promote thermalization, quantum computing device 140 can be securely attached to quantum computing device mount 430.

In some embodiments, at 906, computer-implemented method 900 can comprise providing a thermalizing material into the enclosure with the quantum computing device, wherein the thermalizing material is adapted to thermally link a cryogenic device to the quantum computing device. In an example, thermalizing material 360 can be added to hollow body 620 at opening 770 and traverse through hollow body 620 to enter enclosure 320. In this example, because thermalizing agent, a thermal conductor, fills enclosure 320 so as to immerse quantum computing device 140 and make contact with enclosure 320, which is thermally coupled to mixing chamber plate 295 of dilution refrigerator, a thermal link has been established between quantum computing device 140 and a cryogenic device.

In some embodiments, method 900 can be implemented by a computing system (e.g., operating environment 1000 illustrated in FIG. 10 and described below) or a computing device (e.g., computer 1012 illustrated in FIG. 10 and described below). In non-limiting example embodiments, such computing system (e.g., operating environment 1000) or such computing device (e.g., computer 1012) can comprise one or more processors and one or more memory devices that can store executable instructions thereon that, when executed by the one or more processors, can facilitate performance of the operations described herein, including the non-limiting operations of method 900 illustrated in FIG. 9. As a non-limiting example, the one or more processors can facilitate performance of the operations described herein, for example, method 900, by directing and/or controlling one or more systems and/or equipment operable to perform such operations For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
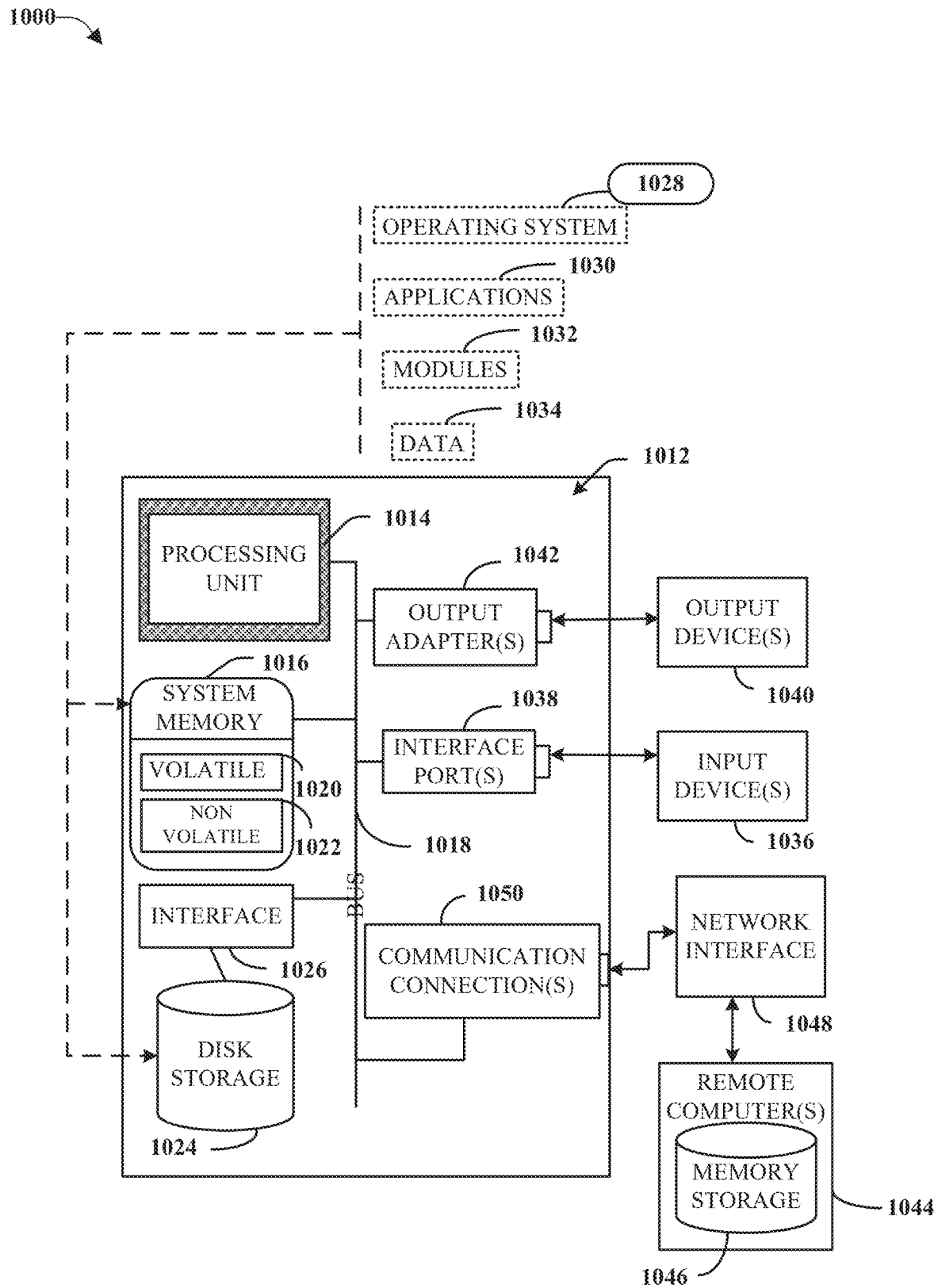
FIG. 10 illustrates a block diagram of an example, non-limiting operating environment in which one or more embodiments described herein can be facilitated.

FIG. 10 depicts an example context the various aspects of the disclosed subject matter, e.g., this figure, as well as the following discussion are intended to provide a general description of a suitable environment in which the various aspects of the disclosed subject matter can be implemented, in accordance with one or more embodiments. Repetitive description of like elements and processes employed in respective embodiments is omitted for sake of brevity.

FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal, and external technologies such as, modems including regular telephone grade modems, cable modems and DSL modems, ISDN adapters, and Ethernet cards.

The present invention may be a system, a method, an apparatus, and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computer, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches, and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a quantum computing device;
   an enclosure having the quantum computing device disposed within the enclosure, wherein the enclosure is leak-tight; and
   at least one thermalizing material disposed within the enclosure, wherein the at least one thermalizing material is adapted to thermally link a cryogenic device to the quantum computing device, and wherein the at least one thermalizing material comprises a liquid thermalizing material, and at least a portion of the quantum computing device is immersed in the liquid thermalizing material.

2. The system of claim 1, wherein the enclosure is coupled to the cryogenic device.

3. The system of claim 2, wherein the cryogenic device is a dilution refrigerator, and wherein the enclosure is coupled to a mixing chamber plate of the dilution refrigerator.

4. The system of claim 1, wherein the enclosure is a part of the cryogenic device.

5. The system of claim 1, wherein the liquid thermalizing material comprises superfluid helium.

6. The system of claim 1, wherein the enclosure comprises an enclosure opening to facilitate providing the liquid thermalizing material therein.

7. The system of claim 6, further comprising:
   a one-piece hollow body defining a fluid path; and
   a valve coupled to the one-piece hollow body, wherein the enclosure opening comprises the valve, and wherein the fluid path traverses multiple stages of the cryogenic device.

8. The system of claim 7, wherein the valve facilitates blocking the enclosure opening to facilitate evacuating excess liquid thermalizing material from the one-piece hollow body.

9. The system of claim 1, wherein the enclosure comprises a connection to interact with the quantum computing device.

10. The system of claim 9, wherein the connection comprises a hermetic microwave feedthrough into the enclosure, coupled to the quantum computing device.

11. The system of claim 9, wherein the connection comprises a direct current feedthrough into the enclosure, coupled to the quantum computing device.

12. The system of claim 1, wherein the at least one thermalizing material further comprises a solid thermalizing material.

13. The system of claim 12, wherein the solid thermalizing material is in contact with the quantum computing device.

14. A method, comprising:
   forming an enclosure, wherein the enclosure is leak-tight;
   disposing a quantum computing device within the enclosure; and
   providing a thermalizing material into the enclosure with the quantum computing device, wherein the thermalizing material is adapted to thermally link a cryogenic device to the quantum computing device, the thermalizing material comprises a liquid thermalizing material, and at least a portion of the quantum computing device is immersed in the liquid thermalizing material.

15. The method of claim 14, further comprising coupling the enclosure to the cryogenic device.

16. The method of claim 14, further comprising:
   coupling a one-piece hollow body defining a fluid path to a valve disposed in an opening in the enclosure, wherein the providing the thermalizing material into the enclosure comprises providing the thermalizing material into the enclosure by employing the one-piece hollow body and the valve in an open state.

17. The method of claim 16, further comprising:
   changing the valve to be in a closed state; and
   evacuating excess thermalizing material from the one-piece hollow body.

18. The method of claim 17, wherein the one-piece hollow body traverses multiple temperature stages of the cryogenic device, and wherein the evacuating the excess thermalizing material from the one-piece hollow body prevents a thermal short between two or more of the multiple temperature stages.

19. The method of claim 14, further comprising, connecting a microwave source to the quantum computing device via a cryogenic connector into the enclosure.

20. The method of claim 14, wherein the liquid thermalizing material comprises superfluid helium.

* * * * *